United States Patent [19]
Callahan

[11] Patent Number: 5,942,924
[45] Date of Patent: Aug. 24, 1999

[54] DIGITAL CIRCUIT FOR CONSERVING STATIC CURRENT IN AN ELECTRONIC DEVICE

[75] Inventor: John M. Callahan, San Ramon, Calif.

[73] Assignee: Enable Semiconductor, Inc., Milpitas, Calif.

[21] Appl. No.: 08/886,620

[22] Filed: Jul. 1, 1997

[51] Int. Cl.⁶ .................................................... H03L 7/00
[52] U.S. Cl. .......................... 327/142; 327/18; 327/198
[58] Field of Search .................................. 327/15, 18, 23, 327/24, 142, 143, 198, 215, 216, 217, 218

[56] References Cited

U.S. PATENT DOCUMENTS

| | | | |
|---|---|---|---|
| 4,039,858 | 8/1977 | Stewart | 307/231 |
| 4,843,264 | 6/1989 | Galbraith | 307/530 |
| 5,111,078 | 5/1992 | Miyamoto et al. | 307/451 |
| 5,374,894 | 12/1994 | Fong | 327/14 |
| 5,638,016 | 6/1997 | Eitrheim | 327/175 |
| 5,770,952 | 6/1998 | Yu | 327/99 |

OTHER PUBLICATIONS

Yukihiro Saeki, et al.; "Low–Power Consumption and Low–Voltage Operation PLA (L2–PLA) Using 1.2um Double Poly–Silicon CMOS E2Prom Technology"; Proceedings of the Midwest Symposium on Circuits and Systems, Champaign; Aug. 14–16, 1989; vol. 2; No. SYMP. 32, Aug. 14, 1989; pp. 1061–1065; IEEE.

*Primary Examiner*—Timothy P. Callahan
*Assistant Examiner*—Jeffrey Zweizig
*Attorney, Agent, or Firm*—Carr & Ferrell LLP

[57] ABSTRACT

This invention relates to a digital circuit for controlling the power usage of an electronic device such as a read only memory (ROM) for a computer device, particularly a portable computer device that relies on a battery power source. The circuit includes the latch, a positive edge detecting circuit, a negative edge detecting circuit, a guaranteed reset circuit, and a delay circuit. Control signals from the device open and close the latch when either a rising or falling edge of these control signals is detected by the edge detecting circuits. The latch itself includes a three input NAND gate and a two input NAND gate. The guaranteed reset circuit ensures that the circuit is initiated. The delay circuit includes a series of inverters and loads. The edge detecting circuits generate a pulse when a rising or falling edge is detected, and include a pulse generating portion, a NAND gate and inverters.

15 Claims, 12 Drawing Sheets

*FIG. 3A*
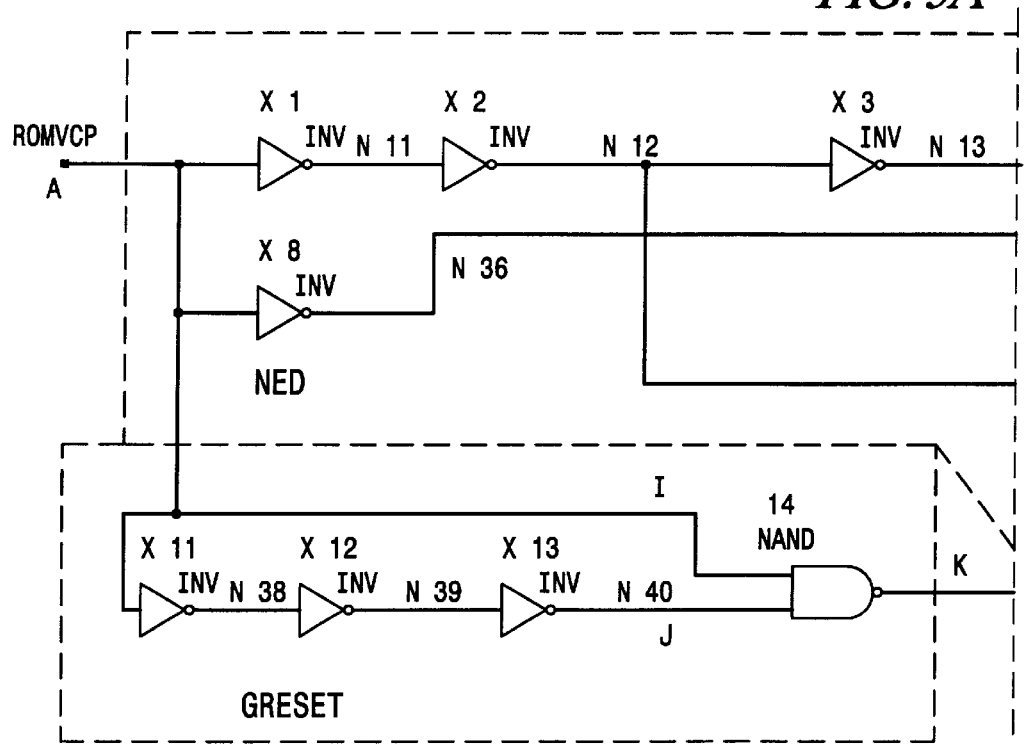
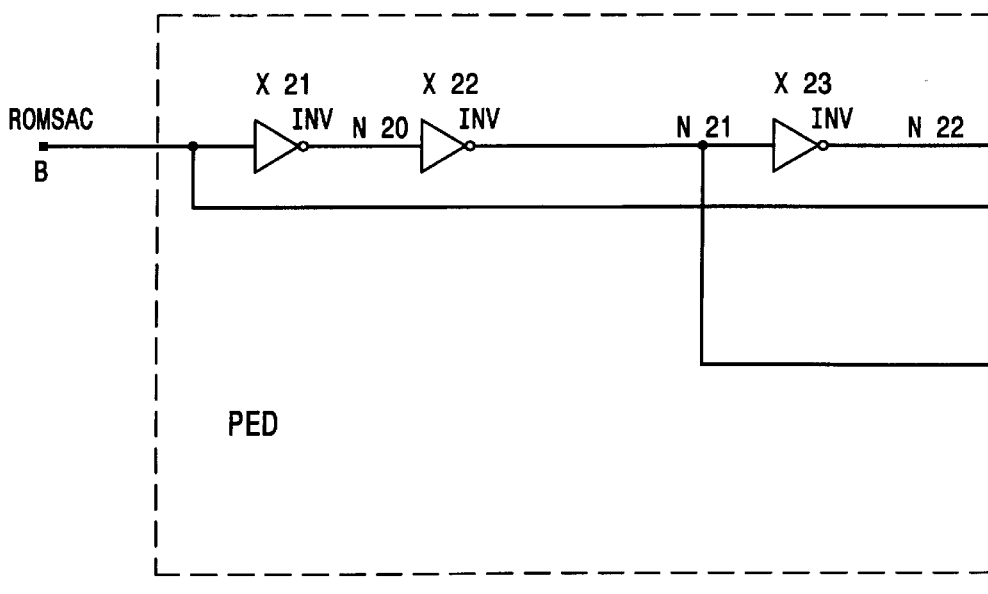
*FIG. 3*
| FIG. 3A | FIG. 3B | FIG. 3C |

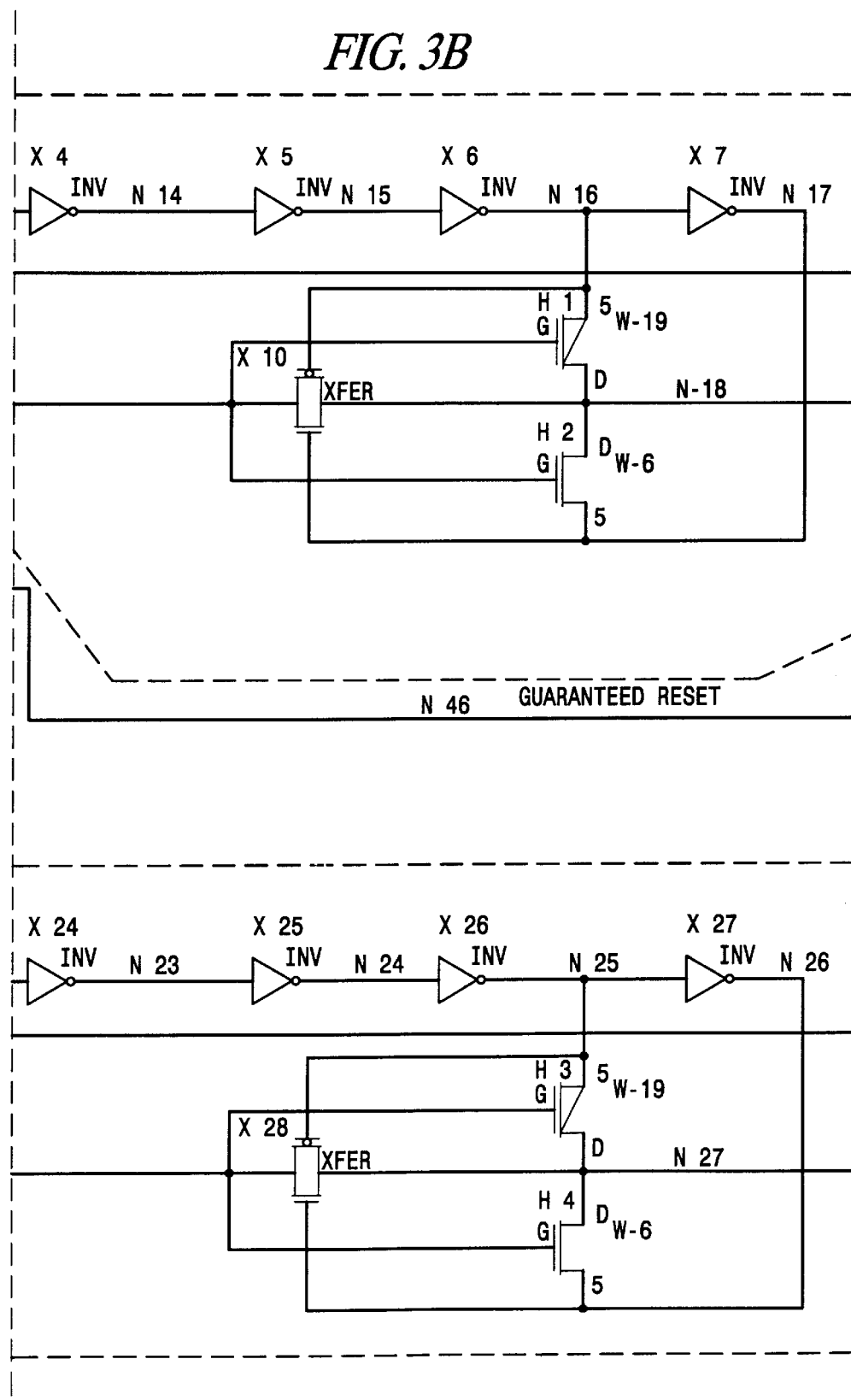

| EDGE(S) | ROMVCP | ROMSAC | NAND1 | | | NAND1' | | | GRESET | | | NAND2 | | | NAND3 | | | YSEL |
|---|---|---|---|---|---|---|---|---|---|---|---|---|---|---|---|---|---|---|
| | A | B | C | D | E | F | G | H | I | J | K | L | M | N | O | P | Q | R |
| (1)+(3) | 1 | 0 | 0 | 0-1-0 | 1 | 0 | 0-1-0 | 1 | 0-1 | 1-0 | 1-0-1 | 1 | 1 | 0 | 1-0-1 | 1 | 1 | R |
| (2) | 0 | 0 | 1 | 0-1-0 | 1-0-1 | 0 | 0 | 1 | 0 | 1 | 1 | 1-0-1 | 0 | 1 | 1 | 1 | 0 | 0 |
| (4) | 0 | 1 | 1 | 0 | 1 | 1 | 0-1-0 | 1-0-1 | 0 | 1 | 1 | 1 | 1 | 0 | 1 | 1-0-1 | 1 | 0 |

*FIG. 7*

DIGITAL CIRCUIT FOR CONSERVING STATIC CURRENT IN AN ELECTRONIC DEVICE

This invention is related to an invention by the same inventor, assigned to the same Assignee and described in a patent application entitled "ROM Bit Sensing," Ser. No. 08/886,616 filed Jul. 1, 1997 which is hereby incorporated by reference in its entirety.

BACKGROUND OF THE INVENTION

The present invention relates generally to digital circuits, and specifically to digital circuits which conserve power in computer memories, particularly in computer devices that run on batteries.

Increasingly, computer devices such as laptops have become portable in response to the demand by consumers to take their work with them for home or for business trips. New devices such as handheld calendars and memo pads have a chief advantage that they too are portable. Such portable computing devices require batteries to run them, and one of the most important problems associated with these computing devices is battery usage. It often takes a long time to recharge a portable computer device, and the user may not be in a situation where he can stop and remain near a particular electrical outlet to run or charge the unit. When the user must become stationary to use the computer device, it defeats the portability feature of the computer. It thus becomes critical to reduce the amount of power usage in portable computer devices so that it is not necessary to recharge these devices so frequently.

Among the many components in a portable computer device is the read only memory (ROM). When a byte or word is received from a memory such as a read only memory (ROM), the state of the byte or word is detected and sent to the computer processor to be acted upon. Meanwhile there is power drawn from the computer device even after the byte or word has been detected, and the state of the byte or word determined. The power that is drawn is referred to as the static current. In such a system, the circuit that detects a series of bits from the ROM is called the ROM bit sensor. Typically, unless there is some method for de-selecting the memory, the bits will continue to drain power from the computer device. De-selecting the memory chip is, however, a comparatively slow process during which static current continues to be drawn.

SUMMARY OF THE INVENTION

The present invention performs the function of conserving the static current with a latch and two edge detecting circuits to shut off the static current without de-selecting the chip. Each of the edge detecting circuits produces a pulse on both the rising and falling edges of a control bit. However, one of these circuits is a negative edge detector and the other circuit is a positive edge detector. The negative edge detecting circuit only transmits a pulse to the latch when a negative edge is detected, while the positive edge detecting circuit only transmits a pulse to the latch when a positive edge is detected.

Two control signal bits are supplied to the digital circuit, the ROMVCP (ROM Voltage Column Precharge) signal and the ROMSAC (ROM SenseAmp Control) signal; one of these signals is supplied to each edge detecting circuit. The ROMVCP signal effectively turns the power on to a given chip, and the ROMSAC signal turns the power off. Preferably, the ROMVCP and ROMSAC signals are supplied by an address transition detection (ATD) unit, which is circuitry that produces a series of signals that start various functions in the computer in response to detecting a transition in the address requested by the computer from the memory. The control signal ROMSAC turns the chip off to conserve power every time there is an address transition at the ROM.

Each of the edge detecting circuits consists of a series of inverters, a NAND gate, and a C-MOS passgate. The NAND gate ensures that, from a pulse generated by pulse generating portion of the edge detector, only a negative or positive edge is passed to the latch. The latch includes a two input NAND gate and a three input NAND gate.

The digital circuit that shuts down the static current additionally includes a guaranteed reset circuit to initiate the NAND gates of the latch so that the digital circuit starts in a state where the static current is in the off condition. This guaranteed reset circuit consists of a plurality of inverters and a NAND gate. A delay line circuit, consisting of a plurality of inverters and loads, acts to delay the termination of the static current after the ROMSAC signal is received.

The preferred application for the present invention is to turn a ROM bit sensing circuit on and off. At the output end of this digital circuit, the Y select clock (YSELCLK) signal is pulsed to permit the ROM bit information to connect to the sensing circuit. After this YSELCLK pulse terminates, the connection between the power supply and the ROM bit sensing circuit is broken. It thus becomes possible to hard-wire the connection and termination of the power supply with the digital circuit of the present invention without de-selecting the chip, which results in additional power savings since the de-selecting process takes longer.

BRIEF DESCRIPTION OF THE DRAWINGS

FIG. 7 shows a detailed timing chart for the digital circuit;

DETAILED DESCRIPTION OF THE PREFERRED EMBODIMENTS

Figure 1:
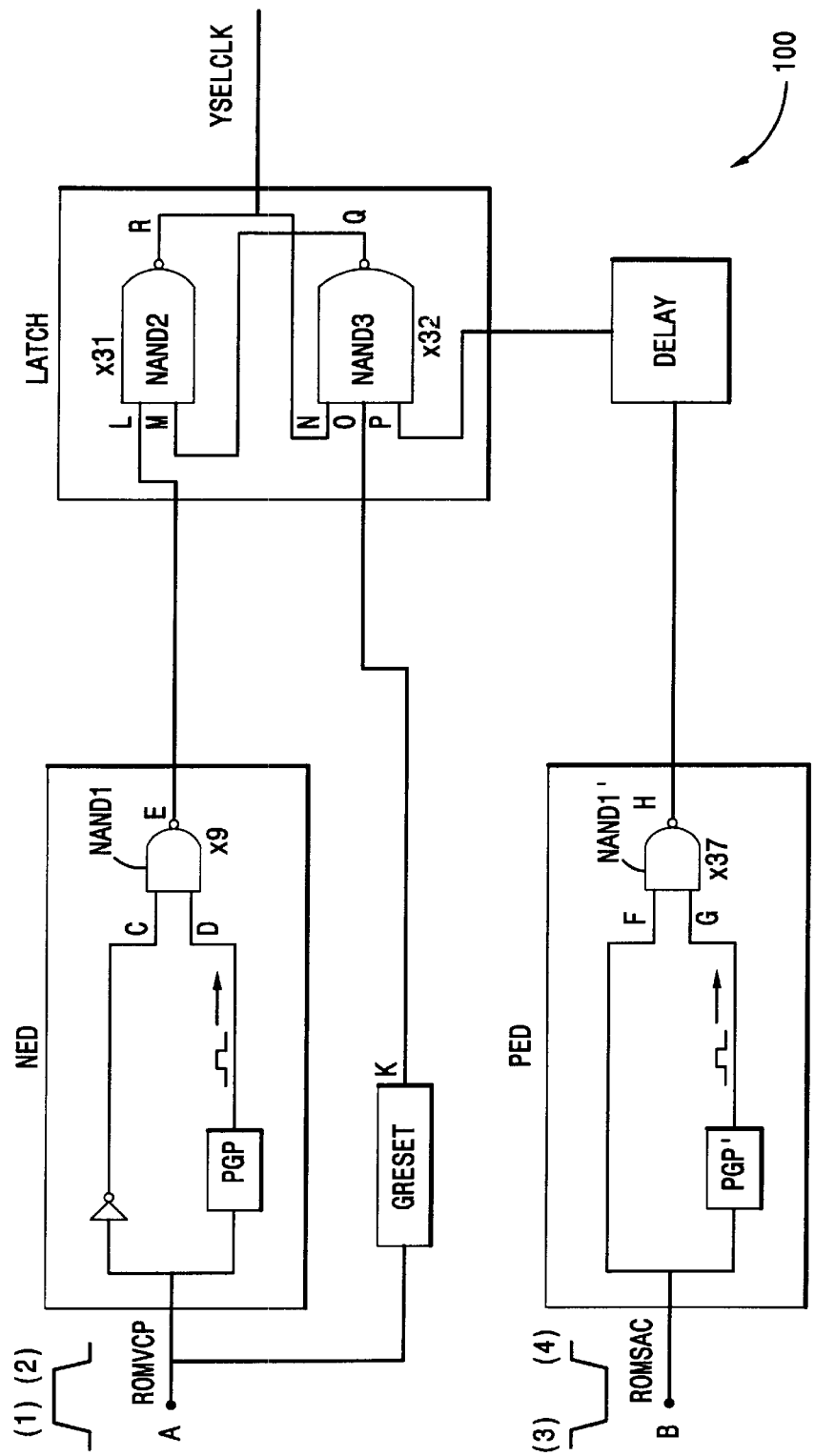
FIG. 1 is a simplified block diagram of the digital circuit.

FIG. 1 shows a digital circuit 100 in simplified block diagram form. Circuit 100 includes a Guaranteed RESET (GRESET) circuit, a Negative Edge Detector (NED) circuit, a Positive Edge Detector (PED) circuit, a Delay circuit, and a latch circuit. A ROMVCP signal pulse consisting of leading (1) and trailing (2) edges is applied at node A at the input to the negative edge detecting (NED) circuit. Circuit NED includes a pulse generating portion (PGP) that produces a pulse at each of the leading (1) and trailing (2) edges of the ROMVCP signal. However, circuit NED includes a NAND gate X9 which only passes the pulse when circuit NED detects a negative edge. Edge (1) is a rising or positive edge, so the pulse generated by the pulse generating portion PGP does not pass NAND gate X9. Edge (2) is a falling or negative edge, so a pulse generated by the pulse generating portion PGP passes through the gate NAND1.

The ROMSAC signal pulse, consisting of a falling or negative edge (3) and a rising or positive edge (4), is applied at node B to a positive edge detecting (PED) circuit. The PED circuit includes a pulse generating portion PGP' that produces a pulse for each edge of the ROMSAC signal pulse. Because PED is a positive edge detector, its NAND gate X37 only lets this pulse through when PED detects a positive edge. Only positive edge (4) produces a pulse that gets through the positive edge detecting (PED) circuit.

The pulses that are released from the NAND1 gates of edge detecting circuits NED and PED have the form of 1-0-1. These pulses are applied to the LATCH circuit, which consists of NAND gates X31 and X32. The LATCH circuit toggles the YSELCLK output from a logical "zero" to a logical "one" at edge (2) and back to a logical "zero" at a delay time after edge (4). The YSELCLK signal turns on the static current at edge (2) and off after edge (4).

FIG. 1 also shows a guaranteed reset (GRESET) circuit and a time delay (DELAY) circuit. The GRESET circuit resets the LATCH and ensures that the YSELCLK output is "zero" after edge (1). The GRESET circuit thereby initiates the digital circuit of FIG. 1.

Figure 2:
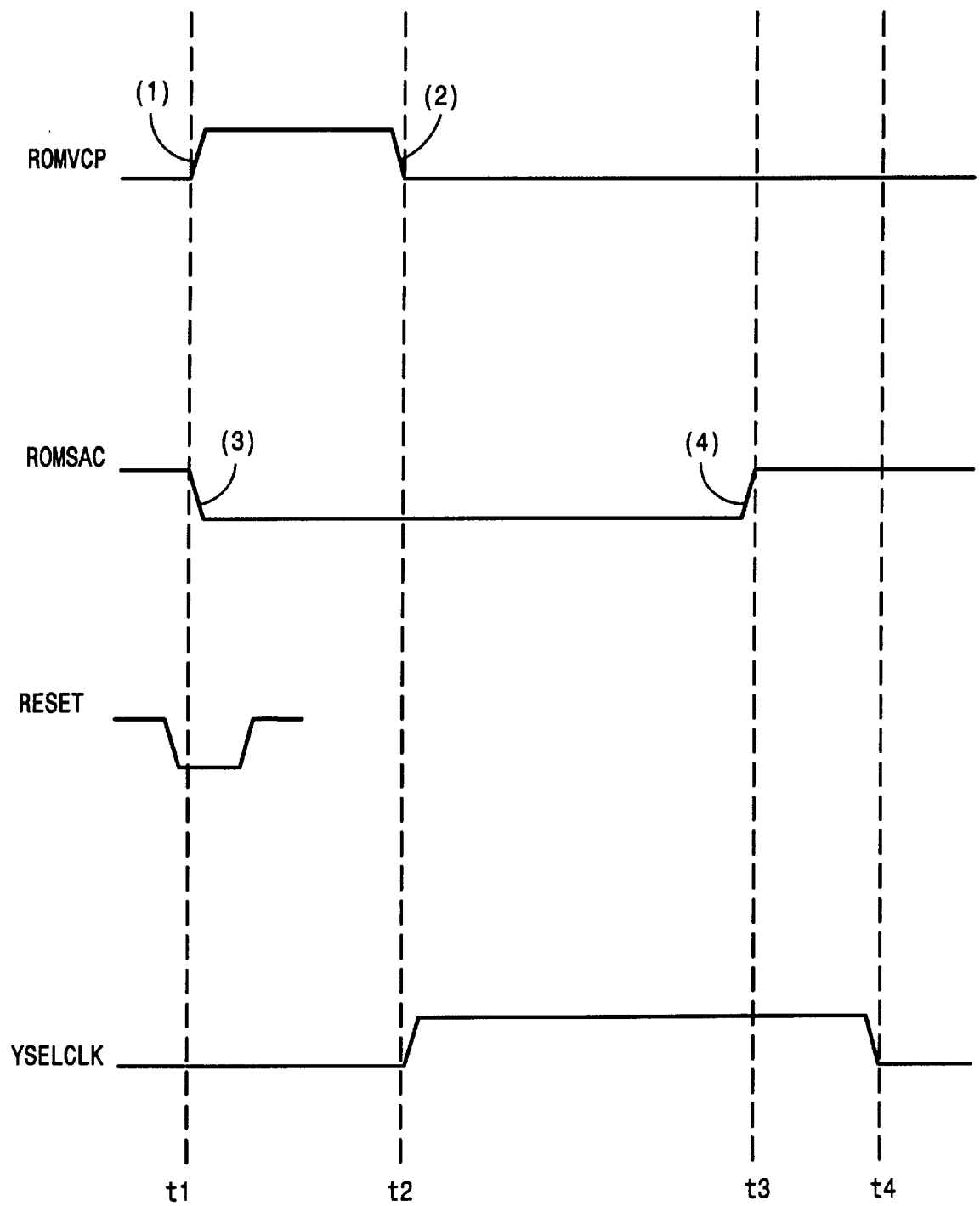
FIG. 2 shows a timing diagram for the digital circuit.

The DELAY circuit consists of various inverters and loads which at some delayed time after edge (4) turn off the YSELCLK signal, as shown in FIG. 2.

FIG. 2 is a timing diagram showing signal pulses input to, used in, and output by the invention. The ROMVCP signal pulse has a rising leading edge (1) and a falling trailing edge (2). The ROMSAC signal pulse has a falling leading edge (3) and a rising trailing edge (4). The ROMVCP signal rising edge (1) and the ROMSAC signal falling edge (3) start at the same time, but the ROMSAC signal pulse outlasts the ROMVCP signal pulse. The YSELCLK output is "zero" through edge (1), goes to "one" at edge (2), and, at a delay time after signal (4), goes back to "zero." The YSELCLK signal output enables the senseamp. Leading edge (1) is a reset edge, and edge (2) changes the YSELCLK signal output to a logical "one," thus turning on the senseamp. A delayed rising edge (4) of the ROMSAC signal changes the YSELCLK output back to a logical "zero," thus turning off the senseamp.

Figure 3C:
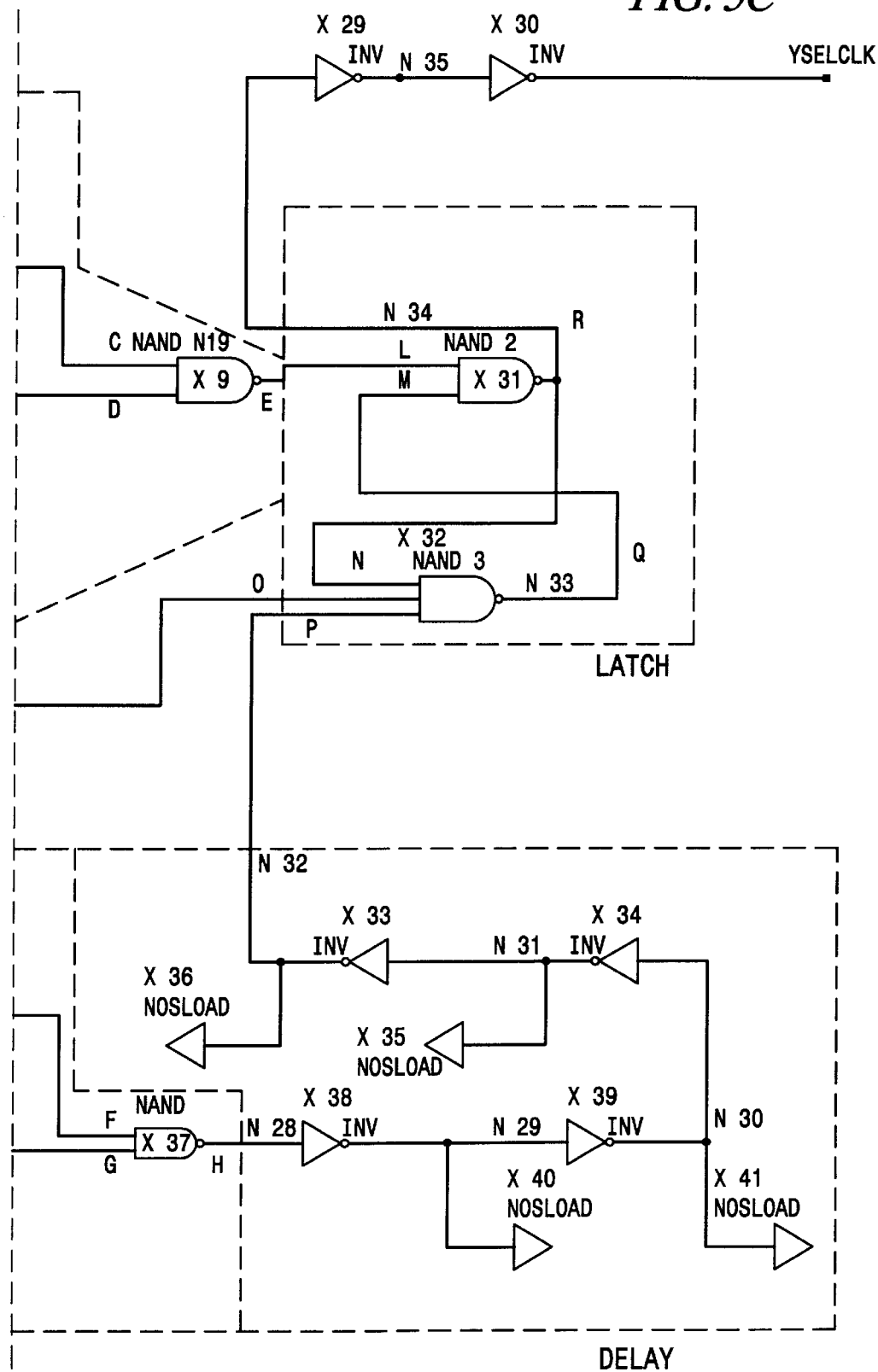
FIG. 3 is a detailed circuit diagram of the digital circuit.

FIG. 3 is a circuit diagram of the invention. The PED circuit includes an input terminal B and an output terminal H connected by a series of inverters X21, X22, X23, X24, X25, X26 and X27, a CMOS passgate X28, NMOS transistor N4, PMOS transistor N3, and a NAND gate X37.

The NED circuit is the same as the PED circuit with the addition of an inverter X8 in the line between its input terminal A and one input of its NAND gate X9.

The GRESET circuit consists of an input terminal connected to node A, an output terminal K, three inverters and a NAND gate.

The DELAY circuit includes an input terminal at node H and an output terminal at node P connected by four inverters in series and four loads.

The LATCH circuit includes input terminals at nodes E, 0 and P, an output terminal at node R, a two input NAND gate X31 and a three input NAND gate X32, and produces an output signal YSELCLK.

Figure 4:
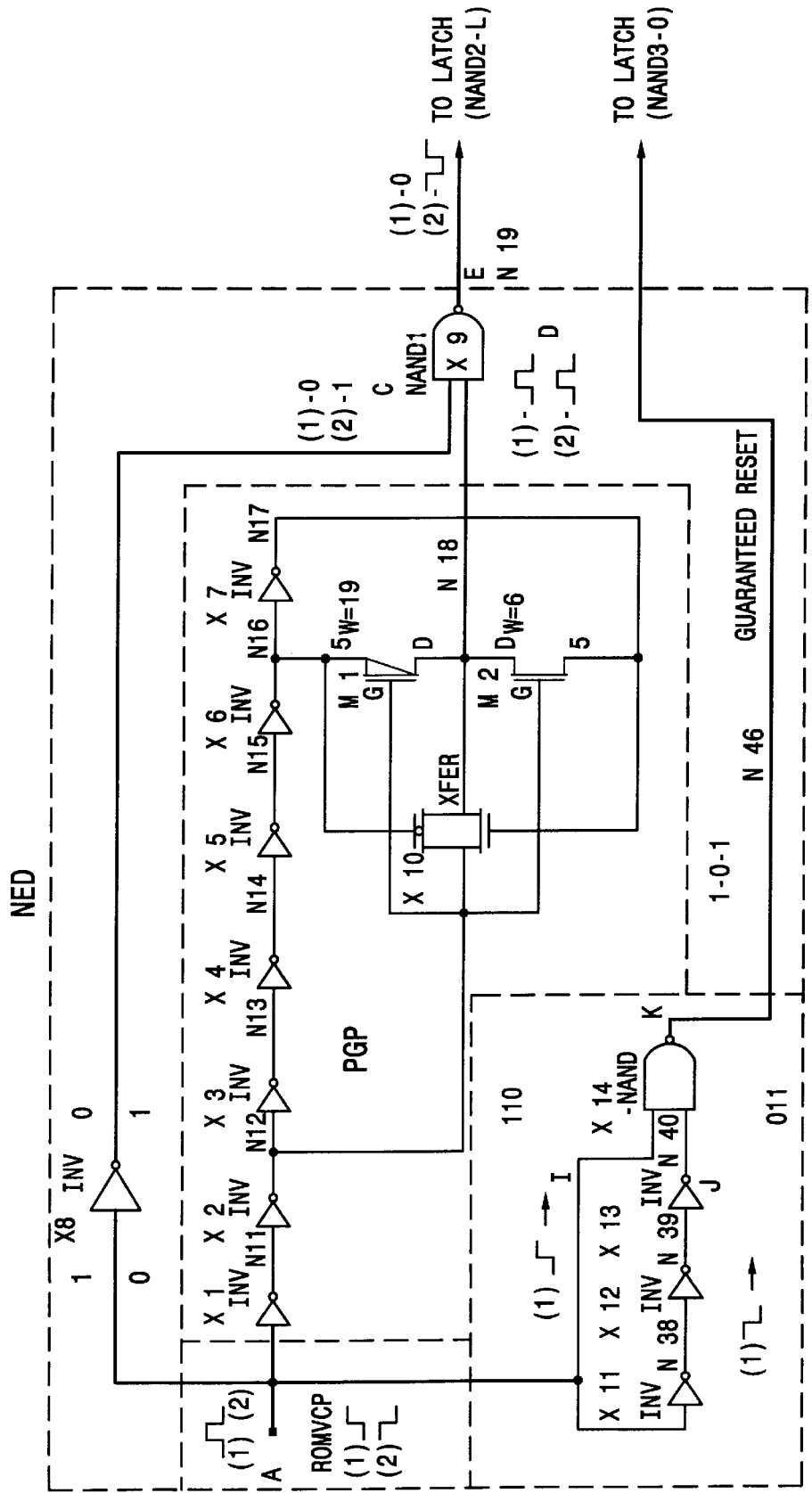
FIG. 4 shows the operation of the negative edge detector.

Referring to FIG. 4, the negative edge detecting (NED) circuit and the guaranteed reset (GRESET) circuit operate as follows. The ROMVCP signal has the form 0-1-0. Initially, a logical "zero" ROMVCP signal is applied through input node A and inverters X11, X12 and X13, which produces a logical "one" at input J to NAND gate X14. At the same time, the ROMVCP logical "zero" is also applied to input terminal I of NAND gate X14 and forces the NAND gate output node K to produce a logical "one" "guaranteed reset" signal. This "one" is applied to input O of NAND gate X32 which resets the LATCH, as will be discussed below.

When the value of signal ROMVCP rises at edge (1), the logical value "one" propagates to input I at NAND gate X14 faster than through inverters X11, X12 and X13, and hence both inputs I and J to NAND gate X14 are "one" until edge (1) propagates through the inverters. During this delay NAND gate X14 outputs a logical "zero."

The ROMVCP "one" value following edge (1), after being delayed through inverters X11, X12 and X13, is inverted to a logical "zero" at input J of NAND gate X14, which forces NAND gate X14 to output a logical "one" at the GRESET output node K. The NAND gate X14 output thus goes from "one" before edge (1) to "zero" following edge (1) and back to "one" after delayed edge (1) arrives, as shown in FIG. 2.

When signal ROMVCP falls at edge (2), the "zero" value applied to input I of NAND gate X14 forces its output at node K to a logical "one" until another rising edge arrives. The 1-0-1 pulse output of the GRESET circuit is applied to input O of NAND gate X32 of the LATCH circuit, as will be described below.

Continuing with FIG. 4, NED circuit initially receives the ROMVCP signal in a "zero" state before edge (1). This "zero" is inverted through inverter X8 to a logical "one" at input C of the NAND gate X9. The initial ROMVCP value of "zero" causes a "zero" value at node 12 at the gates of transistors M1 and M2, and a "zero" at node 16 and a "one" at node 17, which turn on CMOS passgate X10, which passes the "zero" from node 12 to node 18 at the D input to NAND gate X9. The "one" at input C and the "zero" at input D cause NAND gate X9 to output a logical "one" to input L of NAND gate X31 of the LATCH.

After signal ROMVCP rises at edge (1), the ROMVCP value of logical "one" at input A is inverted through inverter X8 to a "zero" at input C of NAND gate X9 whose output E (node 19) remains a logical "one."

Meanwhile, in response to rising edge (1), the NED pulse generating portion PGP produces at input D of NAND gate X9 a pulse whose duration is determined by inverters X3 to X6. This pulse is not transmitted through NAND gate X9 because of the logical "zero" applied at input C. Thus, the NED circuit does not "detect" a rising edge and responsively output a pulse at node E.

Sometime later, as shown in FIG. 2, the falling edge (2) is applied to the NED. Following falling edge (2), signal ROMVCP has a logical value of "zero," which, after inversion by inverter X8 produces a logical "one" at input C of NAND gate X9. Meanwhile, edge (2) causes the pulse generating portion PGP of the NED circuit to apply a 0-1-0 pulse to input D of NAND gate X9. Since there is a logical "one" at input C, the pulse passes through NAND gate X9 and is inverted to a 1-0-1 pulse at output E (node 19).

Figure 5:
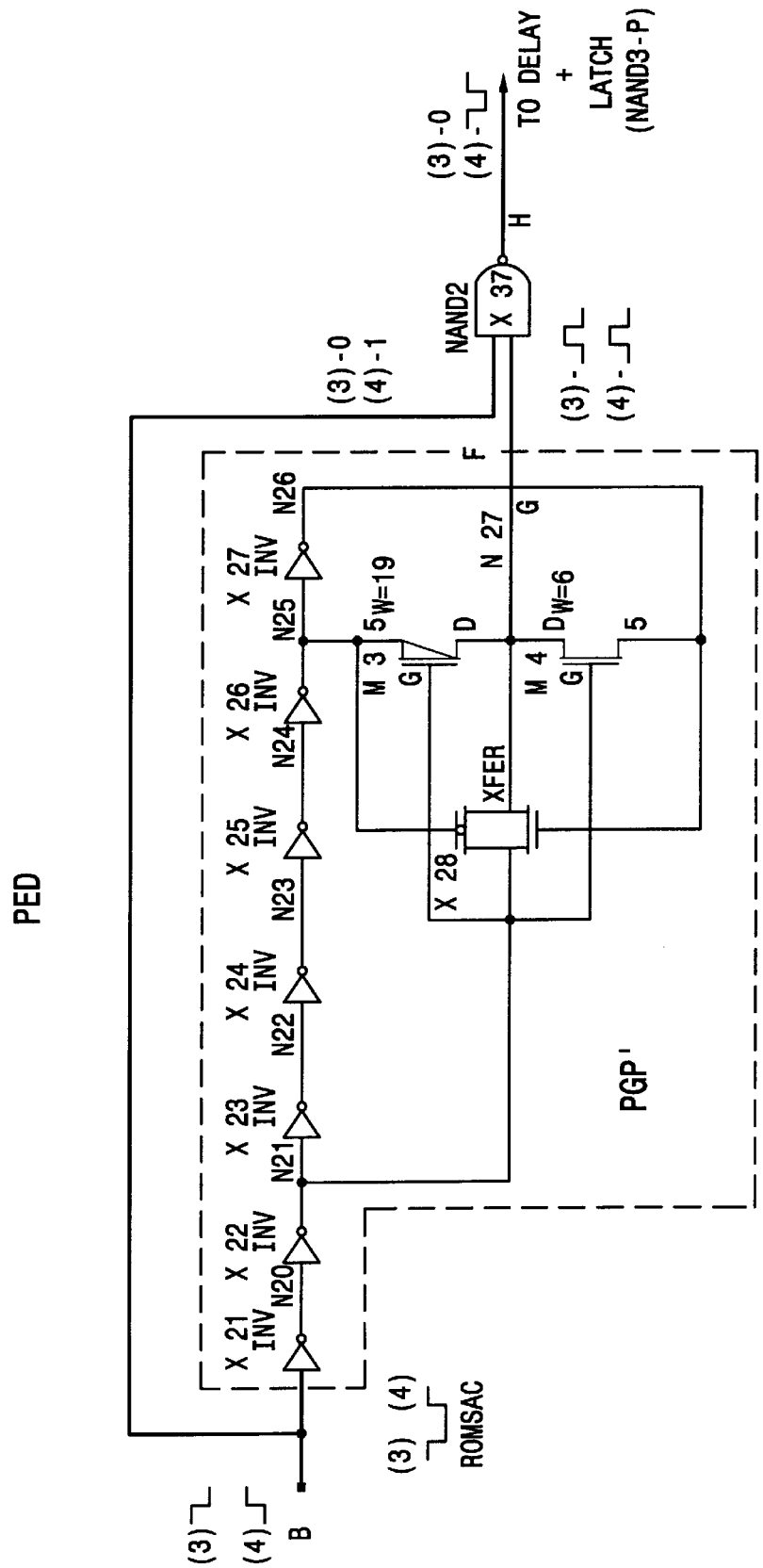
FIG. 5 shows the operation of the positive edge detector.

Referring to FIG. 5, the positive edge detecting (PED) circuit operates as follows. The ROMSAC signal is initially at a logical level "one." As shown in. FIG. 2, at the same time $t_1$ that signal ROMVCP has a rising edge (1), signal ROMSAC has a falling edge (3). The low portion of the ROMSAC signal pulse lasts longer than the high portion of the ROMVCP signal pulse. In contrast to the NED circuit, the PED circuit has a direct line without an inverter between input terminal B and input F of its NAND gate X37. Following edge (3), the ROMSAC signal has a logical "zero" value which is applied to input F of NAND gate X37. Meanwhile, edge (3) is applied to the pulse generating portion PGP' of the PED which produces a pulse whose duration is determined by inverters X23 to X26. This pulse is applied to input G of NAND gate X37. However, since a logical "zero" is applied to input F, NAND gate X37 is forced to output a "one" and cannot pass the pulse. After passing through the DELAY circuit, this logical "one" signal is applied to input P of NAND gate X32 of the LATCH.

Once the ROMSAC rising edge (4) is applied to input terminal B, the logical "one" value reaches node N21 and passes through passgate X28 to present a second logical "one" to the inputs of NAND gate X37 before the logical "one" reaches nodes 25 and 26 and turns off the top and bottom halves, respectively, of passgate 28. This allows NAND gate X37 to output a 1-0-1 pulse, the duration of which depends on the delay through inverters X23–X26. This inverted pulse propagates through the DELAY circuit and then is applied to input P of NAND gate X32 in the LATCH circuit.

Figure 6:
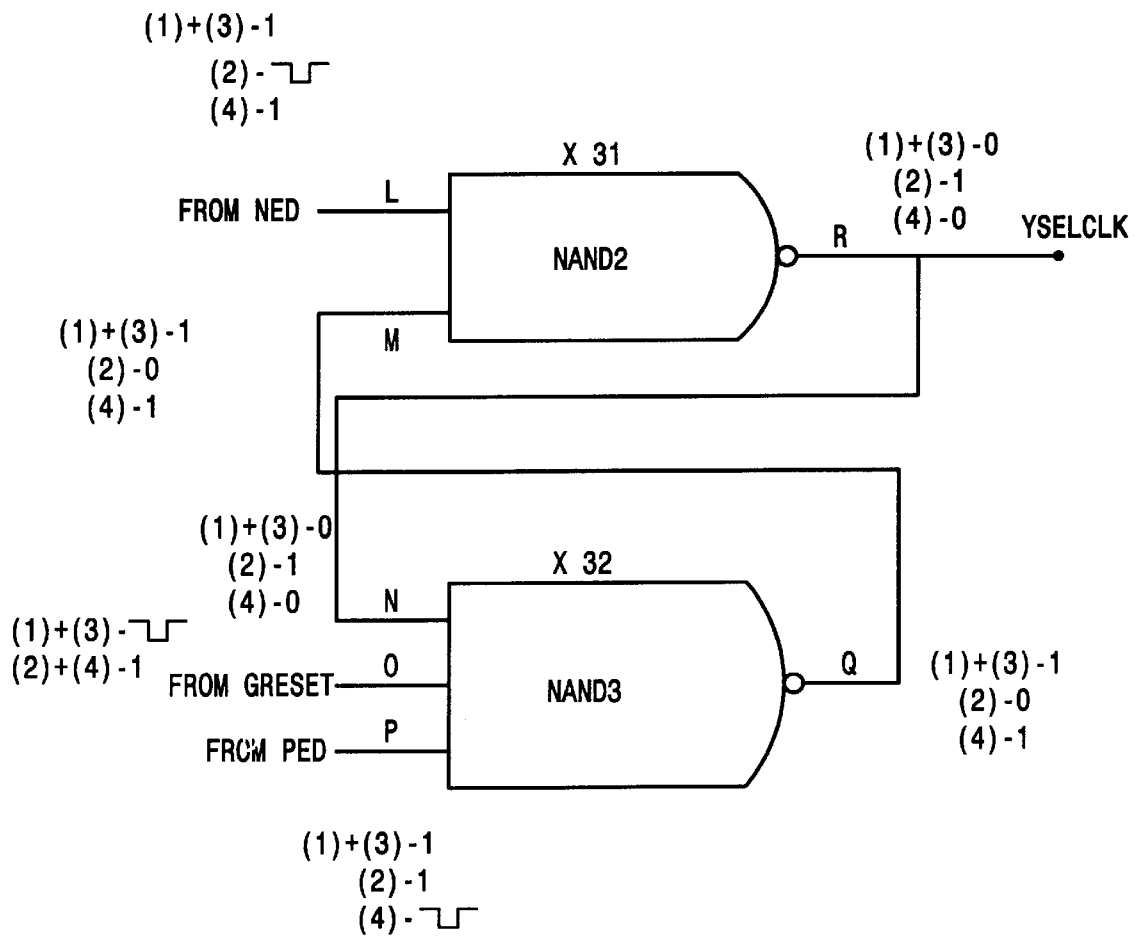
FIG. 6 shows the operation of the latch circuit.

The operation of the LATCH circuit will be described with reference to FIG. 6. According to the FIG. 2 timing diagram, edge (1) and edge (3) occur simultaneously. As previously noted, rising edge (1) causes the NED circuit to produce a logical "one" signal at input L of NAND gate X31 while falling edge (3) causes the PED circuit to produce a logical "one" signal at input P of NAND gate X32 of the LATCH. Meanwhile, the GRESET circuit applies a short 1-0-1 pulse to input O of NAND gate X32, which resets the LATCH to output a logical "zero".

When the GRESET "zero" pulse is applied to input "O," NAND gate X32 outputs a logical "one" which is fed back to input M of NAND gate X31. As noted previously, NAND gate X31 also receives a value of logical "one" at input L from the NED, so the YSELCLK output of NAND gate X31 is "zero" at node R following edges (1) and (3). This YSELCLK signal value of "zero" during the initial reset phase is preferably used to power-off the ROM circuit or other device (not shown) being controlled.

Following edge (1) at time t1, the "one" value ROMVCP signal propagates through delay elements X11, X12, X13 and then applies a "zero" value to node N40 at the second input of NAND gate X14, causing the RESET signal at node 46 to return to a "one" and cease resetting the LATCH.

When falling edge (2) is input to node A, the negative edge detecting circuit NED produces at node E a 1-0-1 pulse which is applied to input L of NAND gate X31, and this sets the LATCH to output at node R a logical "one" value YSELCLK signal.

Meanwhile, during the occurrence of edge (2) at time t2, the ROMSAC signal remains at a logic "zero" level and hence the PED output signal at node H, and the DELAY output signal at node P, remains at a logical "one" level. Thus, all three of lines N, O and P apply logical "one" inputs to NAND gate X32, which outputs on line M (node 33) a logical "zero" that holds the LATCH in its SET state outputting a logical "one" YSELCLK signal. This logical "one" YSELCLK signal is preferably used to turn the power supply "on" to the ROM or other device being controlled.

Next, at time t3 the ROMSAC signal has rising edge (4), following which the ROMSAC value of logical "one" is applied to input B of the PED circuit, which is connected directly to input F of NAND gate X37. Edge (4) is also applied to the pulse generating portion PGP' which, because of the delay through inverters X23 through X26, produces a logical "one" pulse at input G of NAND gate X37. The logical "one" signal at input F and logical "one" pulse at input G cause NAND gate X37 to produce a 1-0-1 pulse which passes through delaying inverters X28, X29, X34 and X33 with delaying loads X40, X41, X35 and X36 of the DELAY circuit, and then arrives at input P of NAND gate X32 of the LATCH.

Following time t2 in the meantime ROMVCP remains at logical "zero" so the NED output at remains a logical "1." The GRESET circuit output also remains at a value of logical "one" at input O of NAND gate X32.

At time t4 when the DELAY circuit outputs the 1-0-1 pulse to input P of NAND gate X32 the "zero" signal resets the LATCH, which thereafter outputs a logical "zero" value YSELCLK signal. Thus, following edge (4) the "zero" YSELCLK signal turns "off" the power supply to the ROM or other controlled device.

FIG. 7 is a timing chart showing the input and output signal values in circuit 100 at times t1, t2, t3 and t4.

Figure 8:
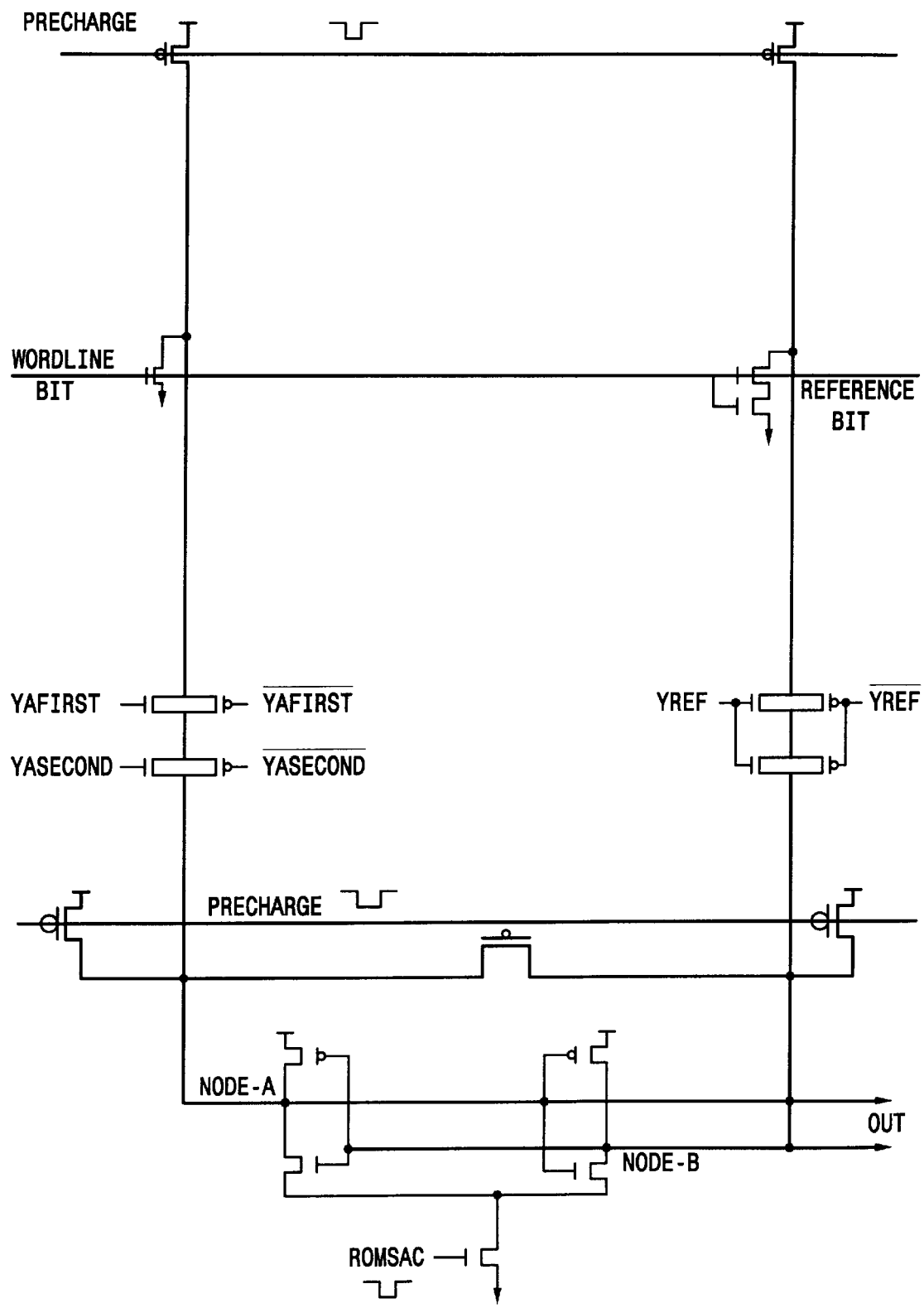
FIG. 8 is the bit detection circuit that is controlled by the digital circuit.
Figure 9:
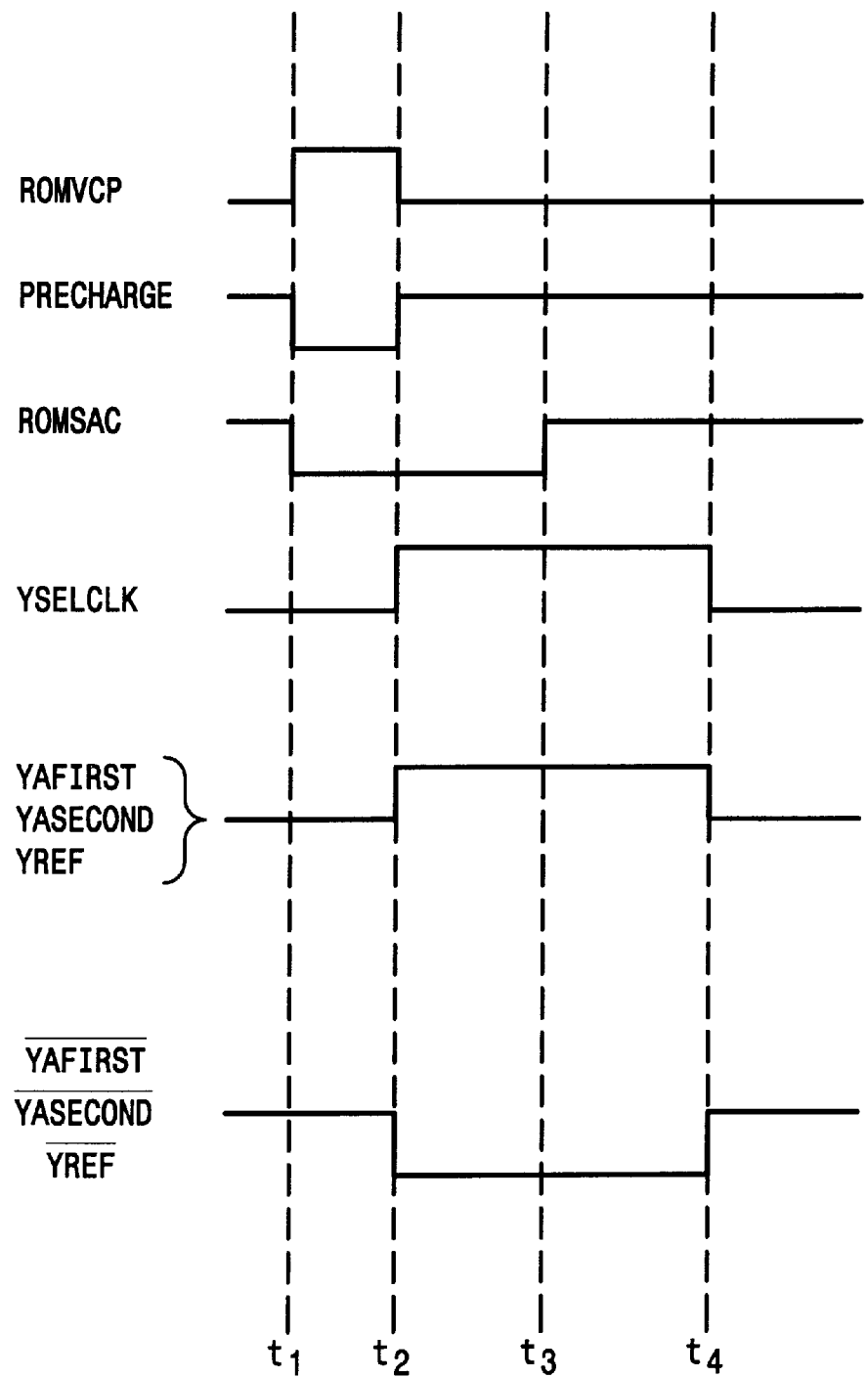
FIG. 9 is a timing diagram for the circuit of FIG. 8.

FIG. 8 is a schematic diagram of the ROM bit sensing circuit that is preferably controlled by digital circuit 100 of the present invention. There are two y select transfer gates to get through in order to hook the bit and reference bit to the senseamp. The signals that turn on these selects are labeled YAFIRST, YASECOND, YREF, and their inversions. Comparing FIG. 8 with the FIG. 9 timing diagram, the precharge signal goes low and the bit line, reference bit line, Node A, Node B and all points between the y select transfer gates, get charged up to voltage VCC. This is possible because ROMSAC is low, and does not allow charge to get to ground from Node A and Node B.

The precharge pulse then goes inactive or high. At the same time, the wordline rises up to VCC, and the y select signals activate. The y select signals are enabled by YSELCLK in their decoders. Eventually, sufficient differential builds up between the bit line and the reference bit line and this is transferred to Node A and Node B. The ROMSAC signal then goes high, which grounds the senseamp latch and forces Node A and Node B to go to either zero or VCC, depending on whether a bit has been programmed. (A bit is programmed if a bit transistor is present; a bit is not programmed if a bit transistor is not present.)

Figure 10A:
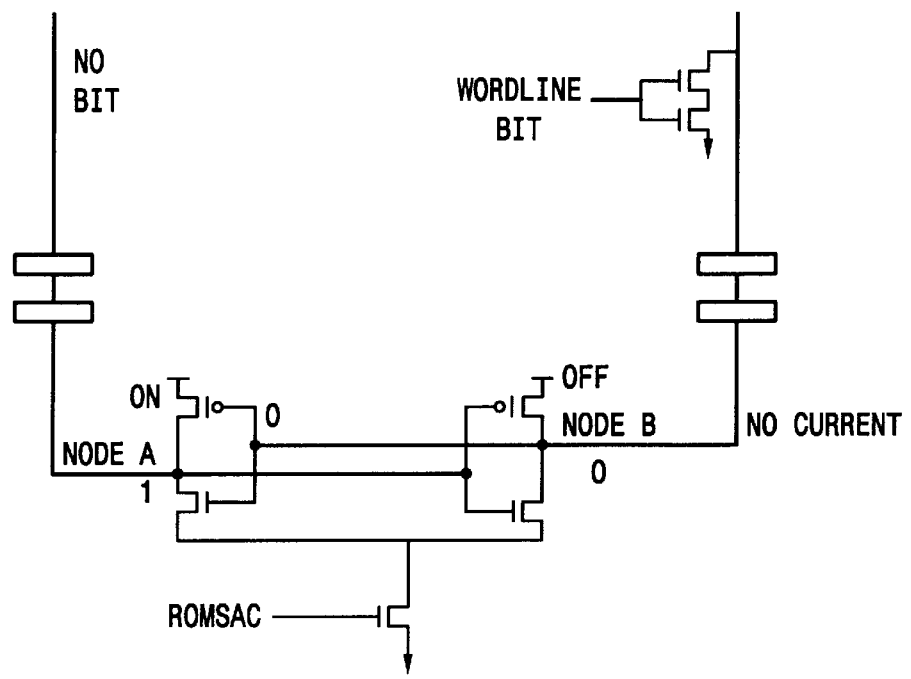
FIGS. 10(*a*) and 10(*b*) show two states of part of the circuit of FIG. 8.
Figure 10B:
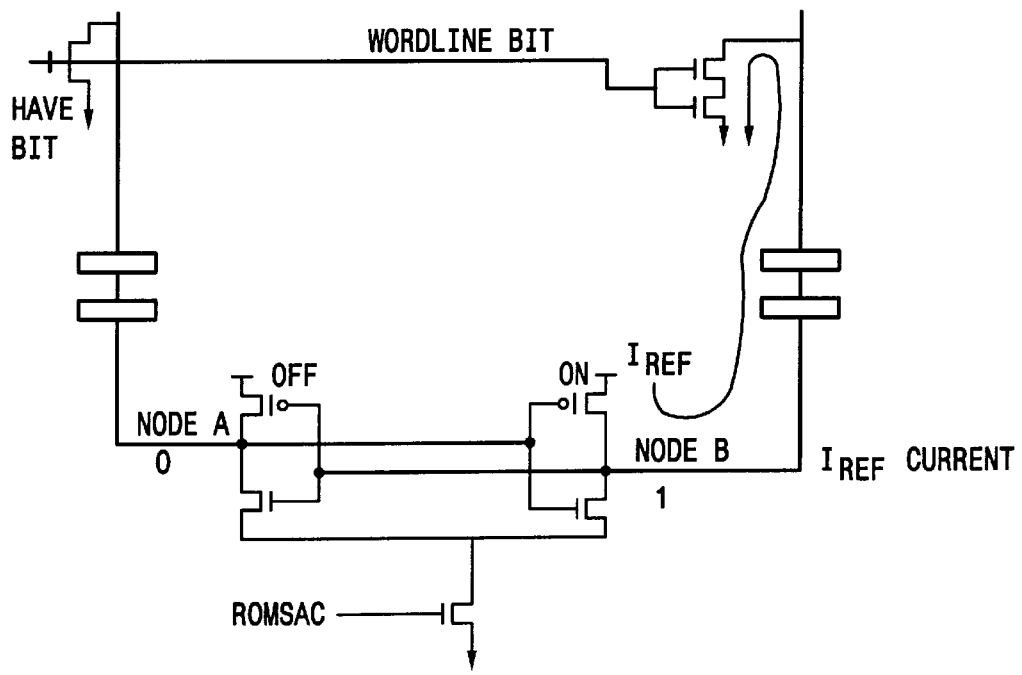

At this point, bit information has been ascertained and the senseamp latch is set. If a bit transistor is not present, Node A is at VCC and Node B is at zero. No current is drawn, as shown in FIG. 10(a). If a bit transistor is present, Node A is at zero and Node B is high. Node B wants to be at VCC but there is a current path from the senseamp pullup PMOS device on Node B through the YREF transfer gates and down to ground through the reference bit. This current is wasted and needs to be eliminated. It is stopped by YSELCLK going to zero and disabling all the y select signals.

The YREF transfer gate has two purposes. One is to duplicate the impedance from the bit line to the senseamp. The other is to act as the gate to be turned off to stop the current.

For every 32 columns, there is one reference bit column. The 32 columns are selected down to one by the two y select stages.

Thus, when an address transition is detected by the address transition circuit, this cues the ROMSAC signal to activate circuit 100 to turn off the ROM bit sensing circuit. Then, when more ROM bits must be detected, the address transition detector applies the ROMVCP signal to the circuit 100 to turn the ROM bit sensor back on.

The present invention has been described in terms of the specific embodiment of a digital circuit for controlling the power supply to a bit detection circuit of a read only memory (ROM) in response to an address transition signal from an address transition detector (ATD). However, the circuit of the present invention is applicable to any circuit that controls the "on" and "off" state of another device, including any other memory, such as a RAM, or another circuit in a computer.

Although the present invention has been described in detail, those skilled in the art should understand that they can make various changes, substitutions and alterations herein without departing from the spirit and scope of the invention in its broadest form.

I claim:

1. A digital circuit for conserving the static current drawn by an electronic device from a power source, comprising:

a first edge detecting circuit for receiving a first control signal and producing a first pulse in response to an edge;

a second edge detecting circuit for receiving a second control signal and producing a second pulse in response to an edge;

a latch circuit responsive to said first and second pulses and producing an output signal, said output signal alternately establishing and terminating a connection between said electronic device and said power source.

2. The digital circuit of claim 1, wherein:

said first edge detecting circuit detects negative edges in said first control signal and said second edge detecting circuit detects positive edges in said second control signal.

3. The digital circuit of claim 1, further comprising:

a guaranteed reset circuit.

4. The digital circuit of claim 3, wherein:

said guaranteed reset circuit includes a NAND gate and a plurality of inverters.

5. The digital circuit of claim 1, further comprising:

a delay circuit.

6. The digital circuit of claim 5, wherein:

said delay circuit includes a plurality of inverters and a plurality of loads.

7. The digital circuit of claim 1, wherein:

said digital circuit controls the power supplied to a memory chip in response to the detection of signal edges.

8. A method utilizing a digital circuit for eliminating a static current drawn by an electronic device from a power source, comprising:

inputting first and second control signals to first and second edge detecting circuits;

detecting leading or trailing edges of said first and second signals with said first and second edge detecting circuits;

applying pulses from said first and second edge detecting circuits to a latching circuit; and producing an output signal from said latching circuit, said output signal controlling said static current.

9. The method utilizing a digital circuit of claim 8, further comprising:

initializing said latching circuit with a reset circuit.

10. The method utilizing a digital circuit of claim 8, further comprising:

delaying pulses from either said first or said second edge detecting circuit with a delaying circuit.

11. A digital circuit for controlling an electronic device, comprising:

a guaranteed reset circuit including combinatorial logic:

a negative edge detector circuit for receiving a first control signal and outputting a first output signal upon detecting a negative edge;

a positive edge detecting circuit for receiving a second control signal and outputting a second output signal upon detecting a positive edge; and a latch circuit for receiving said first and second output signals, and for producing a third output signal for said electronic device, said latch circuit being reset by said guaranteed reset circuit.

12. The digital circuit of claim 11, wherein:

said first and second control signals are produced by an address transition detector circuit upon detecting a transition in an address of data requested by a computer, said digital circuit terminating and establishing a power supply to a memory chip in said computer.

13. The digital circuit of claim 11, wherein:

said negative and positive edge detecting circuits include C-MOS passgates.

14. The digital circuit of claim 11, wherein:

said first control signal has values of 0-1-0, and said second control signal has values of 1-0-1, said negative edge detector detects the trailing negative edge of said first control pulse to turn on said electronic device, and said positive edge detector detects the trailing positive edge of said second control pulse to turn off said electronic device.

15. The digital circuit of claim 11, wherein:

said third output signal goes to a bit detection circuit for a read only memory.

* * * * *